(12) United States Patent
Huang et al.

(10) Patent No.: US 12,727,114 B2
(45) Date of Patent: Sep. 1, 2026

(54) COLD PLATE AND ELECTRONIC DEVICE

(71) Applicant: WISTRON CORP., New Taipei City (TW)

(72) Inventors: Yu-Jei Huang, New Taipei City (TW); Yu Chuan Wu, New Taipei City (TW); Tsen-Hsuan Yen, New Taipei City (TW)

(73) Assignee: WISTRON CORP., New Taipei City (TW)

( * ) Notice: Subject to any disclaimer, the term of this patent is extended or adjusted under 35 U.S.C. 154(b) by 232 days.

(21) Appl. No.: 18/317,148

(22) Filed: May 15, 2023

(65) Prior Publication Data

US 2024/0260229 A1 Aug. 1, 2024

(30) Foreign Application Priority Data

Feb. 1, 2023 (TW) ................................ 112103457

(51) Int. Cl.
*H05K 7/20* (2006.01)

(52) U.S. Cl.
CPC ..... *H05K 7/20254* (2013.01); *H05K 7/20272* (2013.01)

(58) Field of Classification Search
CPC ........... H05K 7/20254; H05K 7/20272; H05K 7/20772; G06F 1/20; G06F 2200/201; F28F 3/12
See application file for complete search history.

(56) References Cited

U.S. PATENT DOCUMENTS 10,999,955 B2 * 5/2021 Wecker .............. H05K 7/20872
11,271,348 B1 * 3/2022 Chen .................... H01R 12/724
(Continued)

FOREIGN PATENT DOCUMENTS

CN 110941316 A 3/2020
FR 3121059 A1 * 9/2022 ......... B23K 20/1205
(Continued)

OTHER PUBLICATIONS

Lozach Alain, "Process for Manufacturing a Heat Exchanger and Heat Exchanger Obtained by Such a Process", Sep. 30, 2022, CAP Profile, Entire Document (Translation of FR 3121059). (Year: 2022).*

(Continued)

*Primary Examiner* — Stephen S Sul
(74) *Attorney, Agent, or Firm* — McClure, Qualey & Rodack, LLP

(57) ABSTRACT

An electronic device includes a casing, an electronic module and a cold plate. The electronic module is accommodated in the casing. The cold plate is located in the casing and includes a liquid cooling main body and a partition structure. The liquid cooling main body is in thermal contact with the electronic module and has an inlet, an outlet and a chamber in communication with the inlet and the outlet. The partition structure is located in the chamber and defines a plurality of first channels and two second channels in the chamber. The first channels are located between and in communication with the two second channels. An extension direction of each of the first channels is different from an extension direction of each of the two second channels, and one of the two second channels is directly in communication with one of the inlet and the outlet.

18 Claims, 16 Drawing Sheets

(56) References Cited

U.S. PATENT DOCUMENTS 11,625,079 B2* 4/2023 Chen .................. H05K 7/20509 361/699
12,133,357 B2* 10/2024 Yang .................. H05K 7/20772
2001/0035285 A1* 11/2001 Ognibene ............. H01L 23/473 257/E23.098
2007/0062673 A1* 3/2007 Olesen .................. F28F 9/0268 257/E23.098
2009/0316360 A1* 12/2009 Campbell ........... H01L 23/4735 361/699
2011/0272120 A1* 11/2011 Joshi ..................... H01L 23/473 165/104.13
2013/0032230 A1* 2/2013 Olesen .................. H01L 23/473 137/561 A
2015/0107801 A1* 4/2015 Campbell ............ H05K 7/2039 165/104.19
2016/0109190 A1* 4/2016 Olesen ...................... F28F 3/12 165/170
2020/0161215 A1* 5/2020 McNamara ......... H01L 23/3672
2020/0229321 A1* 7/2020 Dogruoz .............. G02B 6/4269
2021/0282301 A1* 9/2021 Dogruoz ............ H05K 7/20636
2022/0007551 A1* 1/2022 Jesudhas .............. H05K 1/0203
2022/0173015 A1* 6/2022 Subrahmanyam ........................... H01L 23/4093
2022/0205723 A1* 6/2022 Chen ..................... F28D 1/0316
2022/0210953 A1* 6/2022 Gao ................... H05K 7/20254
2023/0152047 A1* 5/2023 Zhou .................. H05K 7/20254 165/104.19
2023/0380106 A1* 11/2023 Hazra ................ H05K 7/20809
2024/0153846 A1* 5/2024 Bodla ....................... G06F 1/20

FOREIGN PATENT DOCUMENTS

JP 2015133421 A 7/2015
TW M628987 U 7/2022

OTHER PUBLICATIONS

TW Office Action dated 2024-09-03 in Taiwan application No. 112103457.
TW Office Action dated Nov. 7, 2023 in Taiwan application No. 112103457.

* cited by examiner

COLD PLATE AND ELECTRONIC DEVICE

CROSS-REFERENCE TO RELATED APPLICATIONS

This non-provisional application claims priority under 35 U.S.C. § 119(a) on Patent Application No(s). 112103457 filed in Taiwan, R.O.C. on Feb. 1, 2023, the entire contents of which are hereby incorporated by reference.

TECHNICAL FIELD

The disclosure provides a heat dissipation module, more particularly to a cold plate and an electronic device including the same.

BACKGROUND

Due to the progress of science and technology and the influence of marketing demand, heat generated by electronic components in environments such as servers or computer hosts is getting higher and higher. In order to effectively utilize an internal space of a casing, electronic components are usually arranged in the casing with a compact arrangement, but this causes the issue of heat accumulation, which makes it difficult to meet the thermal design powers of existing products by using only conventional air cooling means (e.g., heat sinks).

Accordingly, liquid cold plates and manifolds cooperated with each other are used to dissipate heat generated by the electronic components arranged in the compact arrangement. Specifically, each electronic component may be provided with a set of a cold plate, an inlet pipe and an outlet pipe. By the distribution through the manifold, coolant may flow into the cold plates from different inlet pipes, respectively. After the coolant absorbs heat in the cold plates, the coolant leaves the cold plates from the outlet pipe, respectively, and then converges. However, in such a case, the number of set of the cold plate, the inlet pipe and outlet pipe is required to correspond to the quantity of the electronic components, which increases the overall weight of the liquid cooling system and the complexity of the installation of pipelines involved in the liquid cooling system.

SUMMARY

As a result, the disclosure provides a cold plate and an electronic device including the same which can effectively solve the problems of heavy weight and inconvenient installation of the conventional liquid cooling means.

One embodiment of the disclosure provides an electronic device. The electronic device includes a casing, an electronic module and a cold plate. The electronic module is accommodated in the casing. The cold plate is located in the casing and includes a liquid cooling main body and a partition structure. The liquid cooling main body is in thermal contact with the electronic module and has an inlet, an outlet and a chamber in communication with the inlet and the outlet. The partition structure is located in the chamber and defines a plurality of first channels and two second channels in the chamber. The first channels are located between and in communication with the two second channels. An extension direction of each of the first channels is different from an extension direction of each of the two second channels, and one of the two second channels is directly in communication with one of the inlet and the outlet.

Another embodiment provides a cold plate. The cold plate includes a liquid cooling main body and a partition structure. The liquid cooling main body has an inlet, an outlet and a chamber in communication with the inlet and the outlet. The partition structure is located in the chamber and defines a plurality of first channels and two second channels in the chamber. The first channels are located between and in communication with the two second channels. An extension direction of each of the first channels is different from an extension direction of each of the two second channels, and one of the two second channels is directly in communication with one of the inlet and the outlet.

According to the cold plate and the electronic device as disclosed in the above embodiments, since the liquid cooling main body having only one inlet and only one outlet is used to be in thermal contact with a plurality of electronic components, compared with conventional means where each heat source is provided with one set of a cold plate, an inlet pipe and an outlet pipe, the cold plate of the disclosure can facilitate to achieve a lightweight liquid cooling system in which the cold plate is applied and simplify involved pipelines for easy arrangement and installation of the pipelines. Moreover, the liquid cooling main body of the cold plate of the disclosure has the partition structures disposed therein for dividing the chamber into a plurality of first channels and two second channels, and thus in the case that the liquid cooling main body has only one inlet and only one outlet, the chamber can have a desired distribution of flowing resistance for enabling the electronic components to receive a sufficient amount of coolant.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities.

Figure 1:
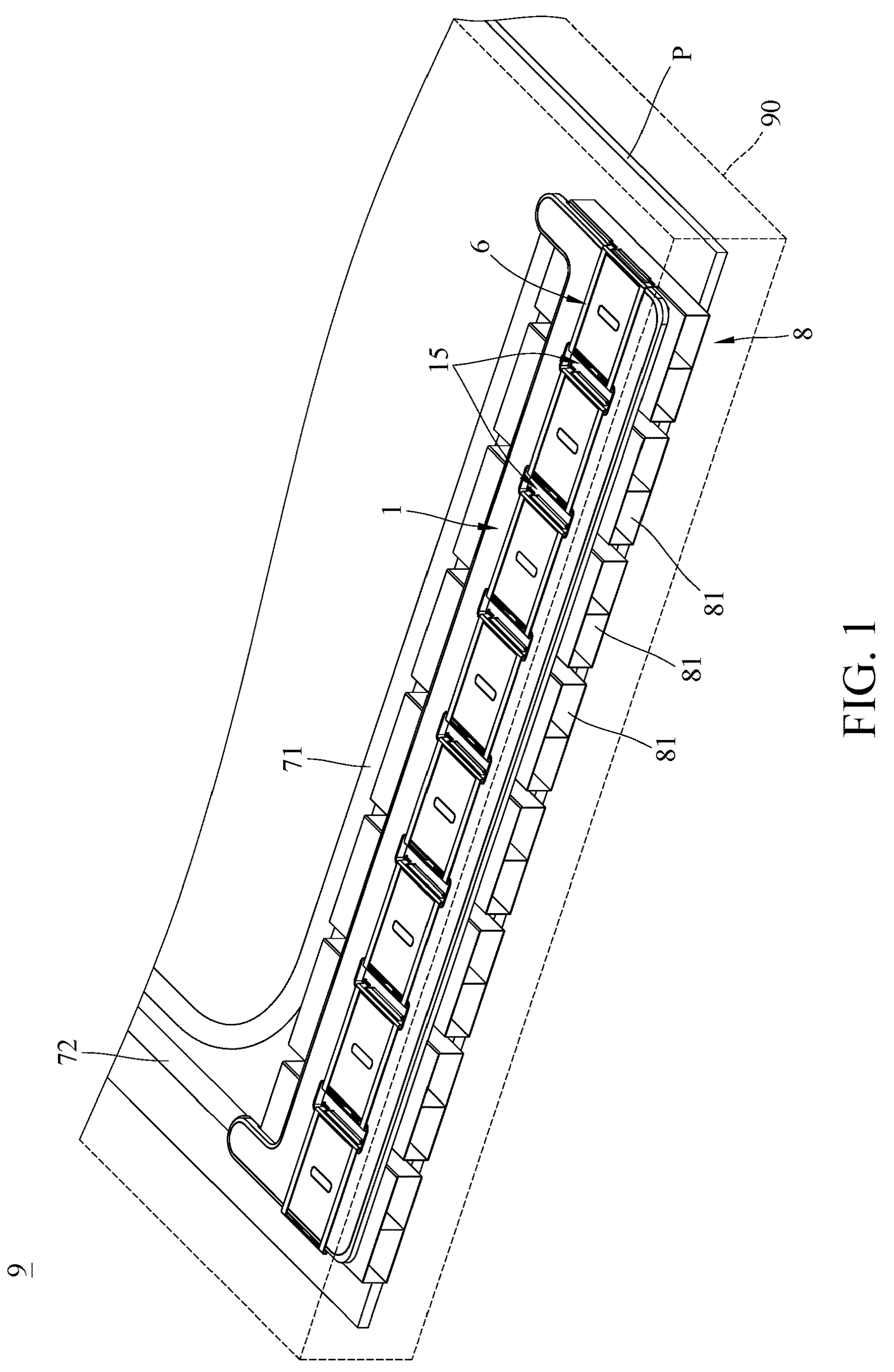
FIG. 1 is a partial and enlarged perspective view of an electronic device according to one embodiment of the disclosure.
Figure 2:
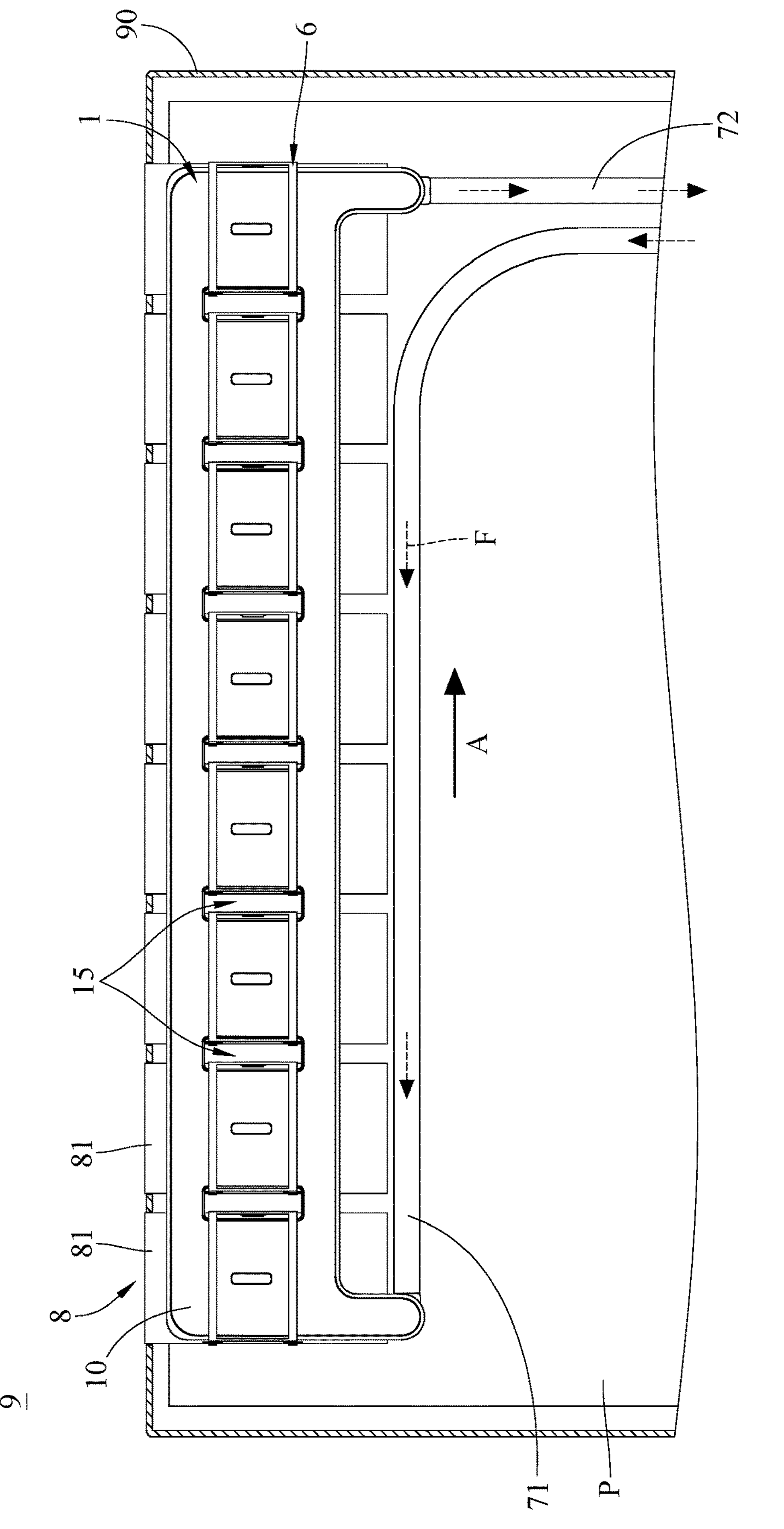
FIG. 2 is a partial and enlarged top view of the electronic device according to one embodiment of the disclosure.

Firstly, referring to FIGS. 1 and 2, one embodiment of the disclosure provides an electronic device 9. The electronic device 9 is, for example, a server, a computer host or a part thereof, but the disclosure is not limited thereto. For example, the electronic device 9 is a 1U server. Note that the type and the application of the electronic device 9 is merely exemplary and not restricted in the disclosure.

The electronic device 9 may include a casing 90. In order to show the interior of the casing 90, the casing 90 is shown by dash lines The casing 90 is a housing that accommodates desired electronic or non-electronic elements, components, modules, structures, assemblies or liquid cooling systems. For example, the casing 90 of the electronic device 9 may accommodate a circuit board P, an electronic module 8 and a cold plate 1. The circuit board P is accommodated in the casing 90. The circuit board P may be, but not limited to, any motherboard for the electronic module 8 to be disposed thereon. The electronic module 8 is accommodated in the casing 90 and disposed on the circuit board P. The electronic module 8 may be, but not limited to, a heat generating module that is required to be cooled. In other words, the electronic module 8 may be referred as a heat source in the casing 90. In this embodiment, the electronic module 8 may include a plurality of electronic components 81, but the quantity of the electronic components 81 are not restricted. For example, in some other embodiments, the electronic module may merely include one electronic component. The electronic component 81 may be a transceiver. In some embodiments, the electronic component 81 may be a transceiver that is 3.5 W to 12 W thermal design power in operation.

In some embodiments where the electronic device 9 equips a plurality of electronic components 81, the electronic components 81 may be arranged on the circuit board P along a suitable direction. As shown in figures, the electronic components 81 may be arranged along an arrangement direction A. The arrangement direction A may be an imaginary straight line predetermined according to an actual requirement, and it is for the purpose of illustration, but not limited the disclosure. For example, in some embodiments where the electronic components 81 are transceivers, in order to allow a user to easily reach the electronic components 81 of the electronic module 8 from the exterior of the casing 90, the electronic components 81 may be arranged on one side of the casing 90 along the arrangement direction A. In this embodiment, the electronic components 81 may be spaced apart from one another by a suitable distance along the arrangement direction A. The said distance may be determined according to the internal space of the casing 90. However, the disclosure is not limited thereto; in some other embodiments, the electronic components 81 may be directly in contact with one another along the arrangement direction A.

The cold plate 1 is accommodated in the casing 90 and disposed on the electronic module 8. Specifically, the cold plate 1 may be accommodated in the casing 90 and directly in thermal contact with all of the electronic components 81 of the electronic module 8 via a suitable means for cooling the electronic components 81. The aforementioned thermal contact is not restricted to represent that two objects conduct heat by directly contacting each other or indirectly contacting each other via another object intervening therebetween unless otherwise particularly specify.

The cold plate 1 may be connected to an inlet pipe 71 and an outlet pipe 72 via a suitable means. The inlet pipe 71 may be connected to a coolant source (not shown). The inlet pipe 71 may receive a coolant (not shown) from the coolant source and supply the coolant to the cold plate 1. When the coolant flows in the cold plate 1, the coolant can absorb heat of the cold plate 1 which is absorbed from the electronic module 8 so as to reduce the temperature of the electronic module 8. The outlet pipe 72 may be connected to a heat dissipation device (not shown). The outlet pipe 72 may receive the coolant that absorbed heat from the cold plate 1 and thus has higher temperature, and provide it to the heat dissipation device, such that the heat dissipation device can cool the coolant, and then the cooled coolant having lower temperature can be provided to the cold plate 1 through the inlet pipe 71 again, thereby forming a cooling circulation for constantly cooling the electronic module 8. Note that the inlet pipe 71, the outlet pipe 72, the coolant source and the heat dissipation device are used for clearly introducing the purpose of the cold plate 1, and the disclosure is not limited thereto.

Figure 3:
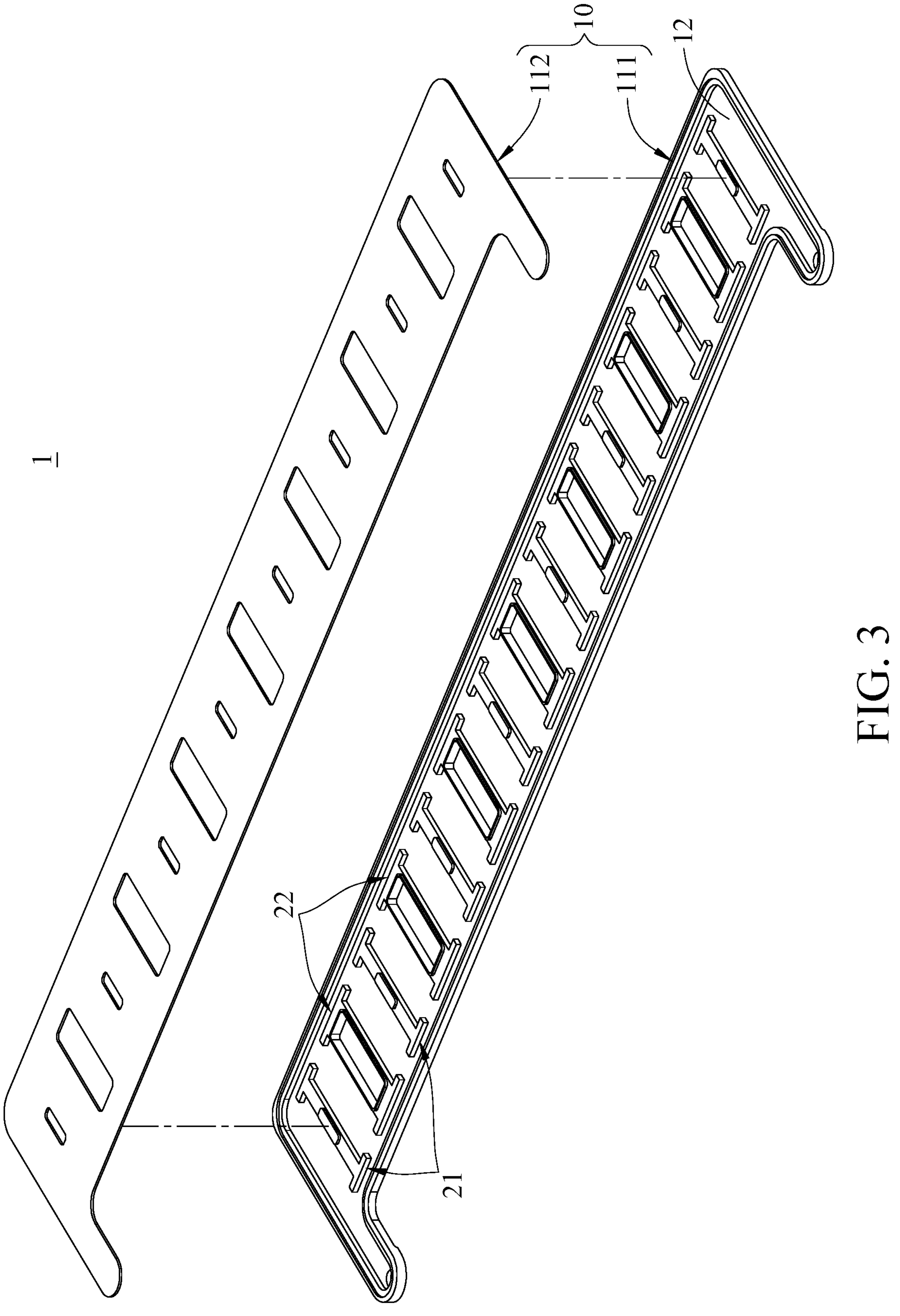
FIG. 3 is an exploded view of a cold plate according to one embodiment of the disclosure.
Figure 4:
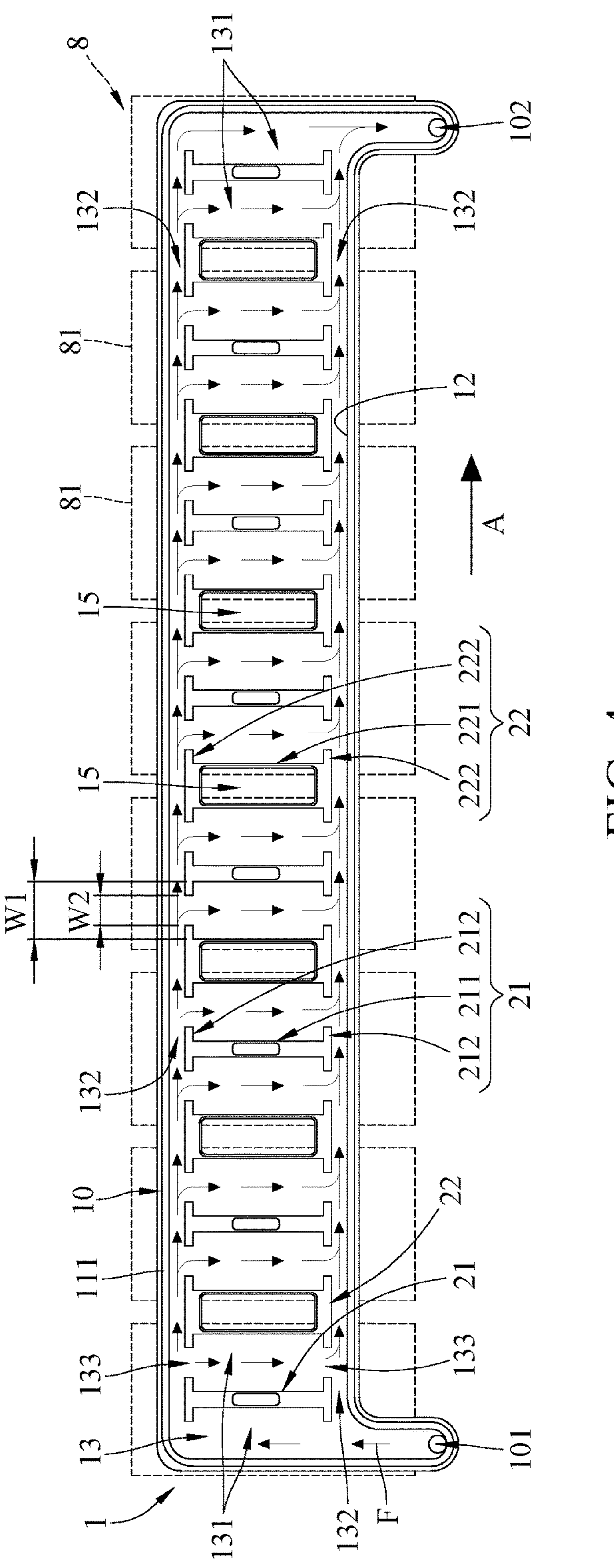
FIG. 4 is a top view of the cold plate according to one embodiment of the disclosure.

Referring to FIGS. 3 to 4, the following paragraphs will further introduce the cold plate 1. As shown in figures, in this embodiment, the cold plate 1 may include a liquid cooling main body 10. The liquid cooling main body 10 is substantially in a flat shape for facilitating the cold plate 1 to be applicable in the environment with limited height. For example, in some embodiments, the thickness of the thinnest part of the liquid cooling main body 10 may be approximately 3.1 mm. The liquid cooling main body 10 may be made of any suitable materials having a desired thermal conductivity. The liquid cooling main body 10 is a part of the cold plate 1 which is used to be in fluid communication with the inlet pipe 71 and the outlet pipe 72 and is in thermal contact with the electronic module 8. The "fluid communication" described herein is that a fluid can flow between the said objects.

In this embodiment, the liquid cooling main body 10 may include a base portion 111 and a cover portion 112. The base portion 111 is the portion of the liquid cooling main body 10 which is used to be stacked on the electronic module 8. The cover portion 112 may be fixed to or stacked on the base portion 111 via any suitable means, but the disclosure is not limited thereto. For example, in some other embodiments, the liquid cooling main body of the cold plate may be made of one single piece via 3D printing process or another suitable process; that is, in this embodiment, the base portion and cover portion of the liquid cooling main body may be integrally formed as one single body during manufacturing process.

Optionally, the liquid cooling main body 10 may include a plurality of through hole portions 15. The through hole portions 15 penetrate through the liquid cooling main body 10 and respectively correspond to gaps among the electronic components 81. Optionally, as shown in FIG. 1 or 2, the liquid cooling main body 10 may be fastened to the electronic module 8 via a plurality of fasteners 6. The fasteners 6 may be components that press against one side of the cold plate 1 and are disposed through the through hole portions 15 so as to be removably engaged with one or more electronic components 81 of the electronic module 8, but the disclosure is not limited to the fasteners 6 and how to fix the liquid cooling main body. For example, in the cold plate of some other embodiments, the liquid cooling main body thereof may be firmly fixed to the electronic module by adhesive, or the liquid cooling main body may be directly engaged with the electronic module via its structures. Alternatively, in the cold plate of another embodiment, the cold plate may be fixed to the electronic module by using one fastener.

In this embodiment, the liquid cooling main body 10 has an inner surface 12 and a chamber 13. The inner surface 12 is referred to the inner surface of the liquid cooling main body 10 which defines the chamber 13; that is, the inner surface 12 is the surfaces of the base portion 111 and the cover portion 112 which face inwards to define the chamber 13. The chamber 13 is an inner space of the liquid cooling main body 10 which is used to accommodate the coolant and allow the coolant to flow therein. Note that, in order to clearly show the chamber 13, the liquid cooling main body 10 may be shown by the base portion 111, and the cover portion 112 may be omitted in some figures.

In addition, the liquid cooling main body 10 may have an inlet 101 and an outlet 102 which are in fluid communication with the chamber 13. The inlet 101 is a channel of the liquid cooling main body 10 which is in fluid communication with the inlet pipe 71 so as to allow the coolant to flow into the chamber 13 from the inlet pipe 71. The outlet 102 is a channel of the liquid cooling main body 10 which is in fluid communication with the outlet pipe 72 so as to allow the coolant to flow to the outlet pipe 72 from the chamber 13. As shown in flowing directions F indicated by arrows in FIG. 4, the coolant can flow into the chamber 13 from the inlet 101 and flow toward the outlet 102 in the chamber 13, such that the coolant can flow out of the chamber 13 from the outlet 102. Note that a pump can be provided on the path of the cooling circulation where the cold plate 1 is located, such that the pump can drive the coolant to flow in the cold plate 1, but the disclosure is not limited to the pump or how to drive the coolant.

In the case that the cold plate 1 receives and discharges the coolant used to perform heat dissipation to the electronic components 81 with one inlet 101 and one outlet 102, the cold plate 1 can have special internal structures therein to enable the chamber 13 to have a distribution of flowing resistance for allowing all of the electronic components 81 of the electronic module 8 to receive sufficient amount of coolant.

Specifically, in this embodiment, the cold plate 1 may further include a plurality of partition structures (e.g., a plurality of first partition structures 21 and a plurality of second partition structures 22 shown in the figures) spaced apart from one another. The first partition structures 21 and the second partition structures 22 may be integrally formed as one body with the liquid cooling main body 10 and located in the chamber 13 via a suitable means, but the disclosure is not limited thereto. For example, in the cold plate of some other embodiments, the first partition structures 21 and the second partition structures 22 thereof may be additionally fixed in the chamber 13 of the liquid cooling main body 10 via any suitable means.

Specifically, the first partition structures 21 and the second partition structures 22 may be disposed on the liquid cooling main body 10 in a staggered arrangement and accommodated in the chamber 13 of the liquid cooling main body 10. More specifically, the first partition structures 21 and the second partition structures 22 may be arranged in the staggered arrangement and spaced apart from one other by a suitable distance along the arrangement direction A in the chamber 13 of the liquid cooling main body 10. In other words, in the liquid cooling main body 10, the first partition structures 21 and the second partition structures 22 may be arranged in the staggered arrangement and spaced apart from one another along a direction parallel to the arrangement direction A of the electronic components 81. Therefore, the so-called arrangement direction A herein may also be referred as an imaginary straight line in which the first partition structures 21 and the second partition structures 22 are arranged. Also, the first partition structures 21 and the second partition structures 22 may be spaced apart from the inner surface 12 of the liquid cooling main body 10 by a suitable distance. As a result, the first partition structures 21 and the second partition structures 22 can divide the chamber 13 of the liquid cooling main body 10 into a plurality of first channels 131, a plurality of second channels 132 and a plurality of communication channels 133 which are in fluid communication with one another.

Specifically, the first channels 131 may be channels defined between any adjacent two of the first partition structures 21 and the second partition structures 22 in the chamber 13 and extending along a direction different from (e.g., perpendicular to) the arrangement direction A, where the first channels 131 located closest to the inlet 101 and the outlet 102 may be defined by the first partition structures 21 and the inner surface 12 of the liquid cooling main body 10; in other words, the first channels 131 may be channels defined by the first partition structures 21 and the second partition structures 22 in the chamber 13 and arranged along the arrangement direction A. The second channels 132 may be channels defined by the first partition structures 21, the second partition structures 22 and the inner surface 12 of the liquid cooling main body 10 in the chamber 13 and extending along the arrangement direction A. Therefore, the first channels 131 and the second channels 132 may extend along different directions, respectively. The communication channels 133 may be channels located between the first partition structures 21 and the second partition structures 22 in the chamber 13 and located between and in fluid communication with the first channels 131 and the second channels 132.

In such a configuration, one of the second channels 132 may be located at one side of the chamber 13 located relatively close to the inlet 101 and the outlet 102 and in fluid communication with the inlet 101 and the outlet 102 with two opposite ends thereof, and another one of the second channels 132 may be located at another side of the chamber 13 located farther away from the inlet 101 and the outlet 102; that is, the first partition structures 21 and the second partition structures 22 are located between the two second channels 132. The first channels 131 may be located between and in fluid communication with the two second channels 132 through the communication channels 133; in other words, the communication channels 133 may be referred as inlets where the coolant flows into the first channels 131 from one of the second channels 132 and outlets where the coolant flows into the other one of the second channels 132 from the first channels 131.

Accordingly, as shown in the flowing directions F indicated by arrows in FIG. 4, a part of the coolant can enter into the second channel 132 located closer to the inlet 101 and the outlet 102 from the inlet 101, such that the coolant can flow from the inlet 101 toward the outlet 102 through the second channel 132; another part of the coolant can enter into the first channel 131 located closest to the inlet 101 from the inlet 101, and then enter into the second channel 132 located farther away from the inlet 101 and the outlet 102, and then sequentially enter into other of the first channels 131 when flowing toward the outlet 102. Note that the first channels 131 defined between the first partition structures 21 and the second partition structures 22 may respectively correspond to the electronic components 81 of the electronic module 8. As a result, the coolant flowing through the first channels 131 can effectively take away heat absorbed from the electronic components 81 of the electronic module 8.

More specifically, in this embodiment, each of the first partition structures 21 may include a main portion 211 and two branch portions 212. The main portion 211 may be referred to a portion of the first partition structure 21 which extends along a direction different from (e.g., perpendicular to) the arrangement direction A, and the branch portions 212 may be referred to other portions of the first partition structure 21 which are connected to two opposite ends of the main portion 211 and substantially extend along the arrangement direction A. In such a configuration, the first partition structure 21 may be I-shaped. Each of the second partition structures 22 may include a main portion 221 and two branch portions 222. The main portion 221 may be referred to a portion of the second partition structure 22 which extends along a direction different from (e.g., perpendicular to) the arrangement direction A, and the branch portions 222 may be referred to other portion of the second partition structure 22 which are connected to two opposite ends of the main portion 221 and substantially extend along the arrangement direction A. In such a configuration, the second partition structure 22 may be I-shaped. Optionally, the through hole portions 15 of the liquid cooling main body 10 may respectively penetrate through the main portions 221 of the second partition structures 22. In other words, the main portions 221 of the second partition structures 22 may respectively correspond to the gaps among the electronic components 81 of the electronic module 8.

In this arrangement, some of the first channels 131 may be referred to be defined by the main portions 211 of the first partition structures 21 and the main portions 221 of the second partition structures 22, the second channels 132 may be referred to be defined by the branch portions 212 of the first partition structures 21, the branch portions 222 of the second partition structures 22 and the inner surface 12 of the liquid cooling main body 10, and the communication channels 133 may be referred to be defined by the branch portions 212 of the first partition structures 21 and the branch portions 222 of the second partition structures 22.

In short, the I-shaped structures (i.e., the first partition structures 21 and the second partition structures 22), arranged along the arrangement direction A of the electronic components 81 and spaced apart from one another, can uniformly distribute the coolant in the chamber 13 of the liquid cooling main body 10 to the electronic components 81. Also, by the shapes of the first partition structures 21 and the second partition structures 22, the widths W1 of the first channels 131 may be greater than the widths W2 of the communication channels 133; that is, the inner diameters of the first channels 131 may be greater than the inner diameters of the communication channels 133; in other words, cross-sectional areas of the inlets and the outlets between the first channels 131 and the second channels 132 may be smaller than cross-sectional areas of the first channels 131. The aforementioned arrangement may moderately increase the resistance to the coolant entering into the first channels 131 so as to cause the first channels 131 to have a distribution of flowing resistance greater than that of other portions in the chamber 13. As a result, a sufficient amount of the coolant can be ensured to be diverted into one or more first channels 121 located closer to the outlet 102. In other words, the first partition structures 21 and the second partition structures 22 can achieve the desired distribution of flowing resistance of the coolant in the chamber 13 for allowing the electronic components 81 located closer to and farther away from the inlet 101 to receive sufficient amount of coolant.

Figures 5, 6:
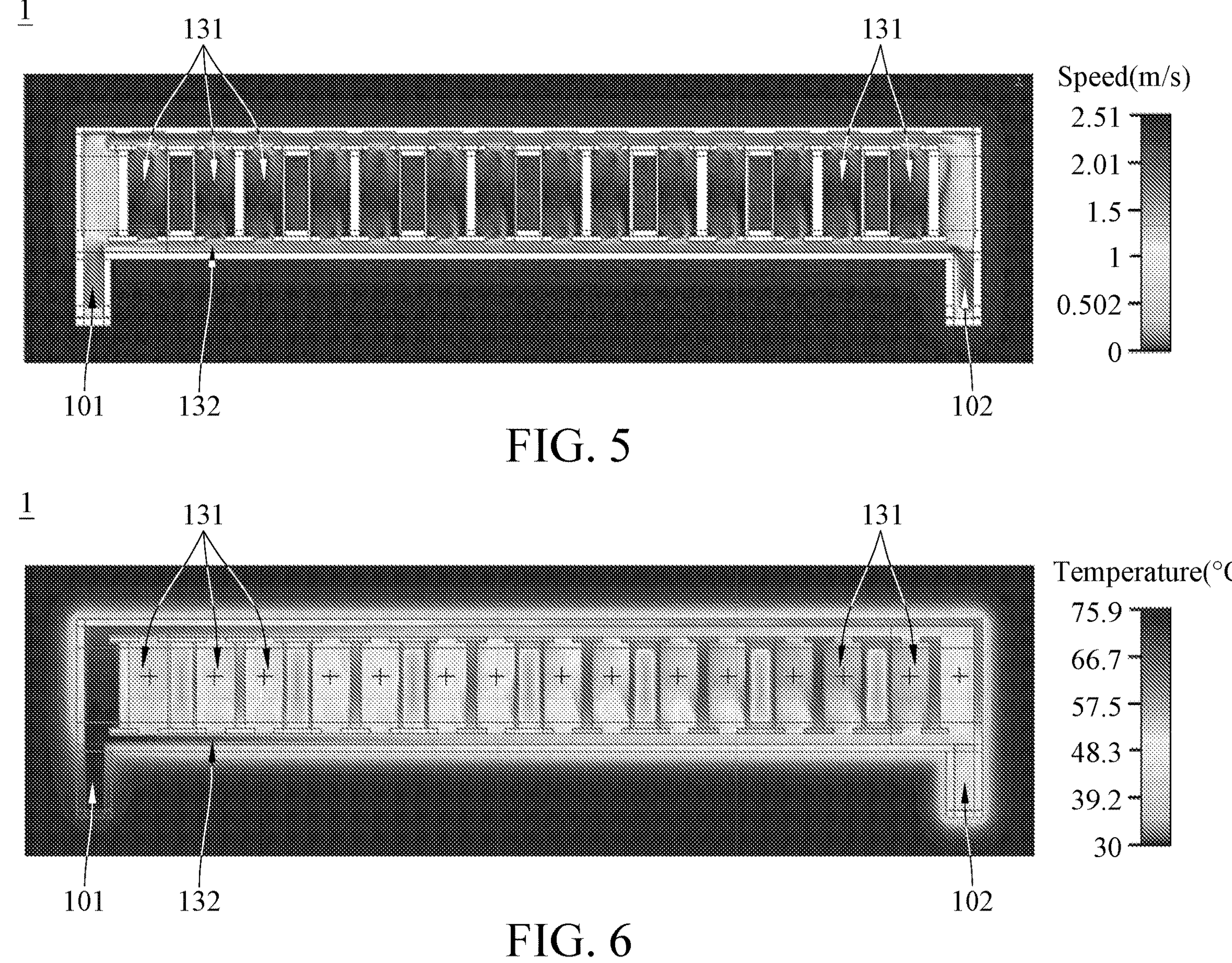
FIG. 5 is a simulation diagram of a distribution of flow velocity in the cold plate in FIG. 2.
FIG. 6 is a simulation diagram of a distribution of temperature of the cold plate in FIG. 2.

For this, referring to FIGS. 5 and 6 simultaneously, they are simulation diagrams of a distribution of flow velocity and a distribution of temperature of the cold plate 1 in FIG. 2. It can be seen that, in the second channel 132 located farther away from the inlet 101 and the outlet 102, the coolant flows with relative high speed when flowing toward the outlet 102, which ensures that there is a sufficient amount of coolant diverted into one or more first channels 131 located closer to the outlet 102 for satisfying the thermal design power of the electronic components located farther away from the inlet 101.

In other words, the distribution of the flowing resistance formed in the chamber 13 by the first partition structures 21 and the second partition structures 22 enables that even though the cold plate 1 has only one inlet 101 and only one outlet 102, all of the electronic components 81 in thermal contact with the liquid cooling main body 10 can still receive a sufficient amount of coolant for heat dissipation. Compared with conventional means where each heat source is provided with one set of a cold plate, an inlet pipe and an outlet pipe, the cold plate 1 of this embodiment can significantly reduce the quantity of pipes, thereby not only reducing the cost, but also saving space and achieving lightweight design. Therefore, the cold plate 1 can be facilitated to be applied in a limited internal space and to reduce the overall weight of an electronic device in which the cold plate 1 is applied. Moreover, since the cold plate 1 can perform heat dissipation with only one inlet 101 and only one outlet 102, an overall pipe resistance thereof may be lower than that of the conventional means that each heat source is provided with one set of the cold plate, an inlet pipe and an outlet pipe, which enables the pump to drive the coolant in an efficient and energy-saving manner.

The above paragraphs introduce the cold plate of one embodiment of the disclosure as exemplary, but the disclosure is not limited thereto. The following paragraphs will introduce other embodiments of the disclosure, which can provide the similar efficacies. However, it should be firstly stated that for the purpose of illustration, the following paragraphs merely introduce the differences between the following embodiments and the previous embodiment, and the same or similar parts among them may refer to the aforementioned paragraphs and will not repeatedly introduce hereinafter. Moreover, the same or similar parts among them may be presented by the same reference numerals.

Figure 7:
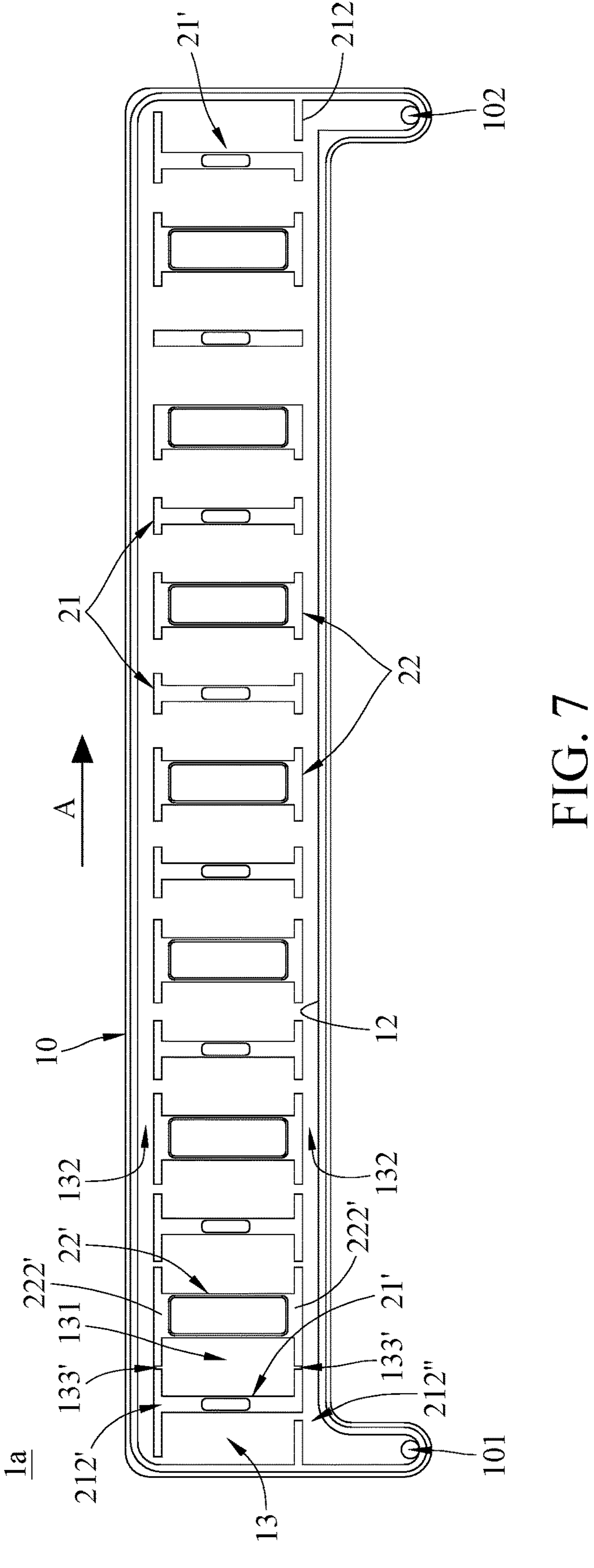
FIG. 7 is a top view of a cold plate according to another embodiment of the disclosure.

For example, referring to FIG. 7, another embodiment of the disclosure provides a cold plate 1*a*, and the main difference between the cold plate 1*a* and the cold plate 1 of the previous embodiment is that, in this embodiment, widths of communication channels 133' between branch portions 212' of first partition structures 21' and branch portions 222' of second partition structure 22' may have a trend to gradually decrease along a direction opposite to the arrangement direction A; that is, the widths of the communication channels 133' may gradually decrease along a direction from the outlet 102 toward the inlet 101; in other words, in the direction opposite to the arrangement direction A, lengths of the branch portions 212' of the first partition structures 21' and the branch portions 222' of the second partition structures 22' may gradually increase. Such arrangement can further increase the resistance to the coolant entering into one or more first channels 131 located closer to the inlet 101 for further ensuring a sufficient amount of coolant to be diverted into one or more first channels 131 located closer to the outlet 102.

In addition, optionally, in this embodiment, in the first partition structure 21' located closest to the inlet 101, a branch portion 212" thereof located closer to the inlet 101 may be directly connected to the inner surface 12 of the liquid cooling main body 10, and the branch portion 212" extends toward the first partition structure 21' located closest to the inlet 101. In this embodiment, optionally, in the first partition structure 21' located closest to the outlet 102, a branch portion 212" thereof located closer to the outlet 102 may be directly connected to the inner surface 12 of the liquid cooling main body 10, and the branch portion 212" extends toward the first partition structure 21' located closest to the outlet 102.

Figure 8:
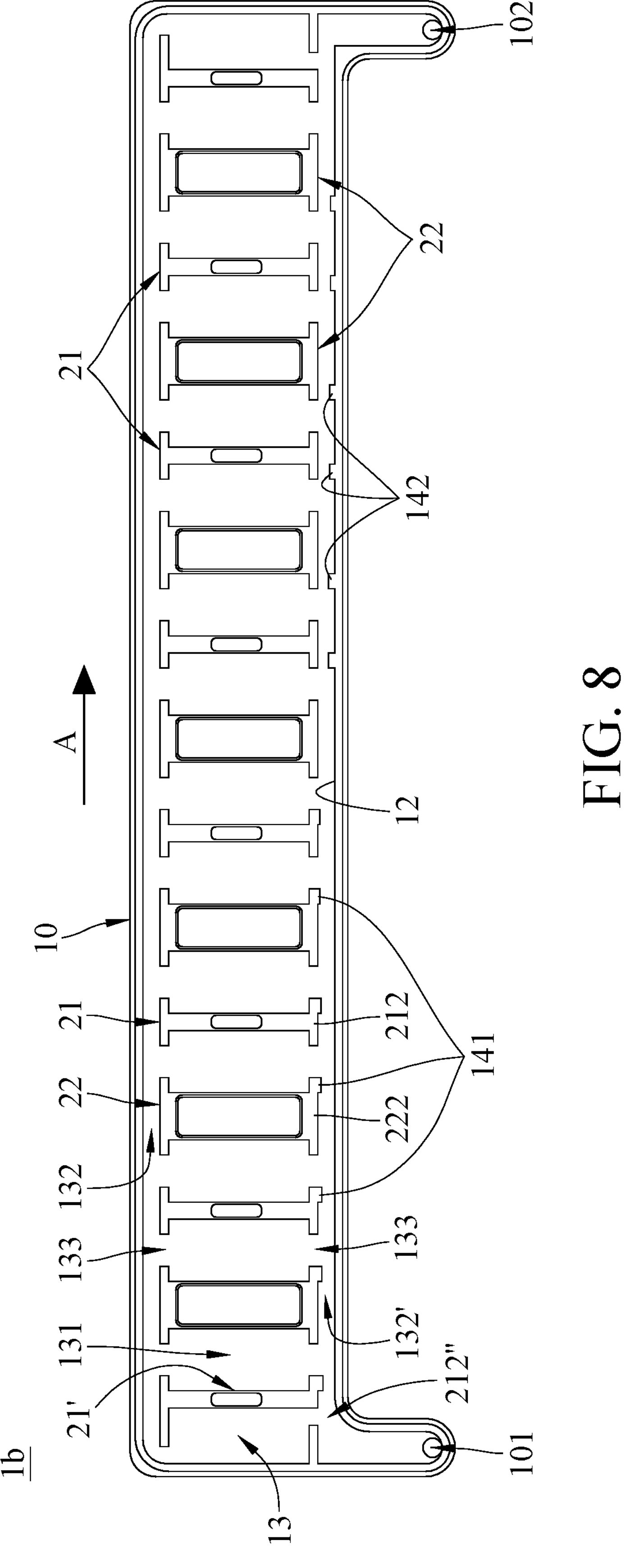
FIG. 8 is a top view of a cold plate according to another embodiment of the disclosure.
Figure 9:
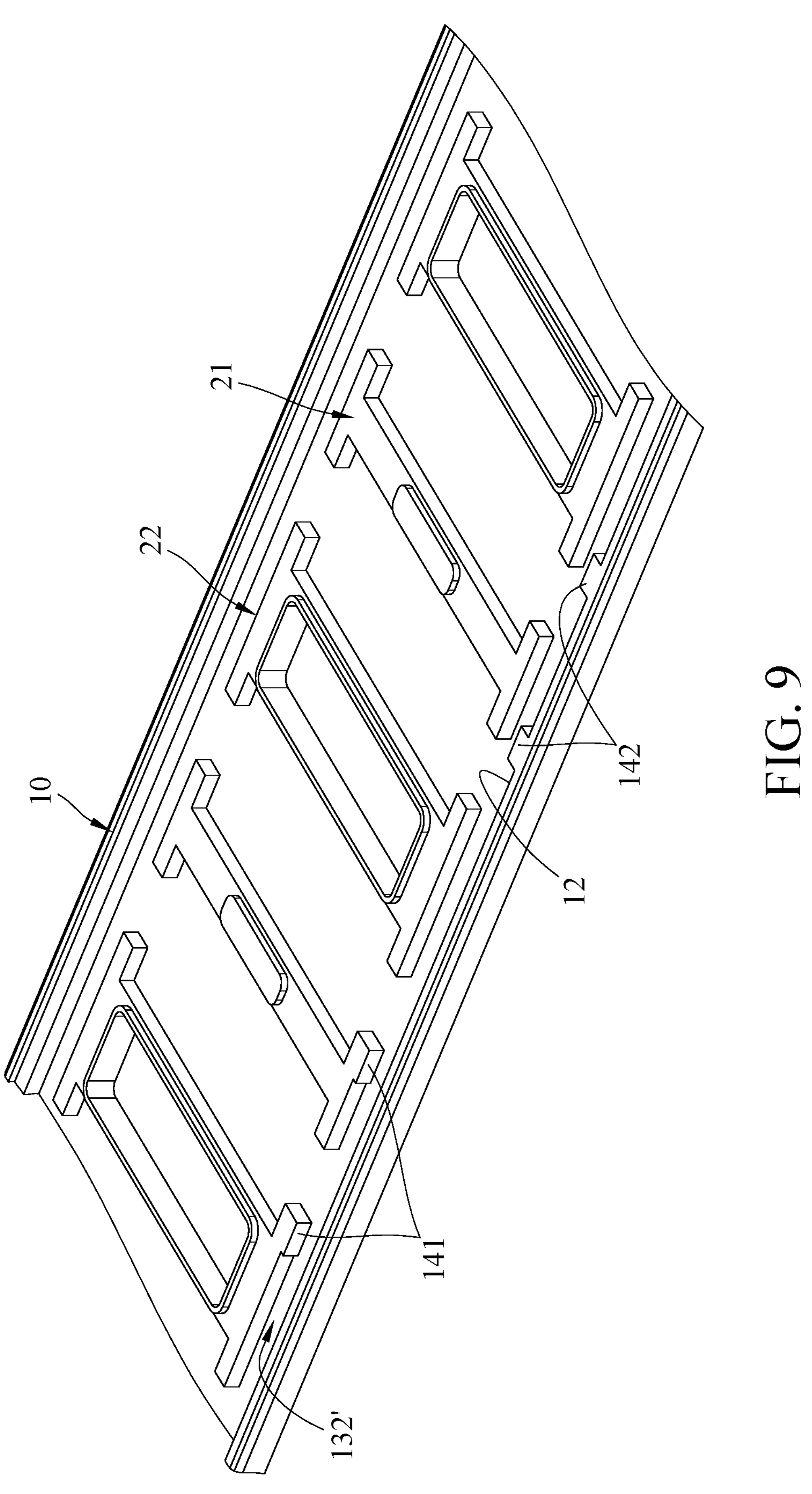
FIG. 9 is a partial and enlarged perspective view of the cold plate in FIG. 8.

Alternatively, referring to FIGS. 8 and 9, another embodiment of the disclosure provides a cold plate 1*b*. The main difference between the cold plate 1*b* and the cold plate 1 of the previous embodiment is that the cold plate 1*b* may further include a plurality of choke blocks 141 and a plurality of guide blocks 142. The choke blocks 141 may be located in one of the second channels (e.g., the second channel 132' shown in the figures) which is located closer to the inlet 101 and the outlet 102, and the choke blocks 141 may be integrally formed on one or more of the branch portions 212 and the branch portions 222 located closer to the inlet 101. The choke blocks 141 can partially change (or reduce) the cross-sectional area of a part of the second channel 132' located closer to the inlet 101. More specifically, the choke blocks 141 may be connected to one or more of the branch portions 212 and the branch portions 222 located closer to the inlet 101 and protrude from ends thereof located farther away from the inlet 101; in other words, the choke blocks 141 may protrude from the branch portions 212 or the branch portions 222 located closer to the inlet 101 at the communication channels 133 for reducing the flow rate of the coolant entering into the first channels 131 through the communication channels 133. Intuitively, when this configuration is disposed in a place or an area of the second channel 132' located closer to the inlet 101, the flow rate of the coolant flowing towards the outlet 102 in the second channel 132' may increase. In addition, the cross-sectional areas of the choke blocks 141 may gradually decrease along the arrangement direction A from the inlet 101, such that the resistance to the coolant flowing into the first channels 131 gradually decreases along the arrangement direction A from the inlet 101 for distributing the flow rate of the coolant flowing into the first channels 131, thereby facilitating a sufficient amount of the coolant flowing through one or more first channels 131 located closer to the outlet 102.

The guide blocks 142 may be located in the second channel 132', and the guide blocks 142 may be integrally formed on an area of the inner surface 12 of the liquid cooling main body 10 located closer to the outlet 102 and correspond to one or more branch portions 212 and branch portions 222 located closer to the outlet 102. More specifically, the guide blocks 142 may correspond to one or more branch portions 212 and branch portions 222 located closer to the outlet 102 and further correspond to ends thereof located farther away from the outlet 102; that is, the guide blocks 142 may protrude from the inner surface 12 which corresponds to the branch portions 212 or the branch portions 222 located closer to the outlet 102 at the communication channels 133 for increasing the flow rate of the coolant entering into the first channels 131 through the communication channels 133. The guide blocks 142 can partially change (or reduce) the cross-sectional area of a part of the second channel 132' located closer to the outlet 102. In addition, the cross-sectional areas of the guide blocks 142 may gradually increase along a direction opposite to the arrangement direction A from the outlet 102, such that the resistance to the coolant flowing into the first channels 131 gradually increases along the direction opposite to the arrangement direction A from the outlet 102 for distributing the flow rate of the coolant flowing into the first channels 131, thereby facilitating a sufficient amount of the coolant flowing through one or more first channels 131 located closer to the outlet 102.

Figure 10:
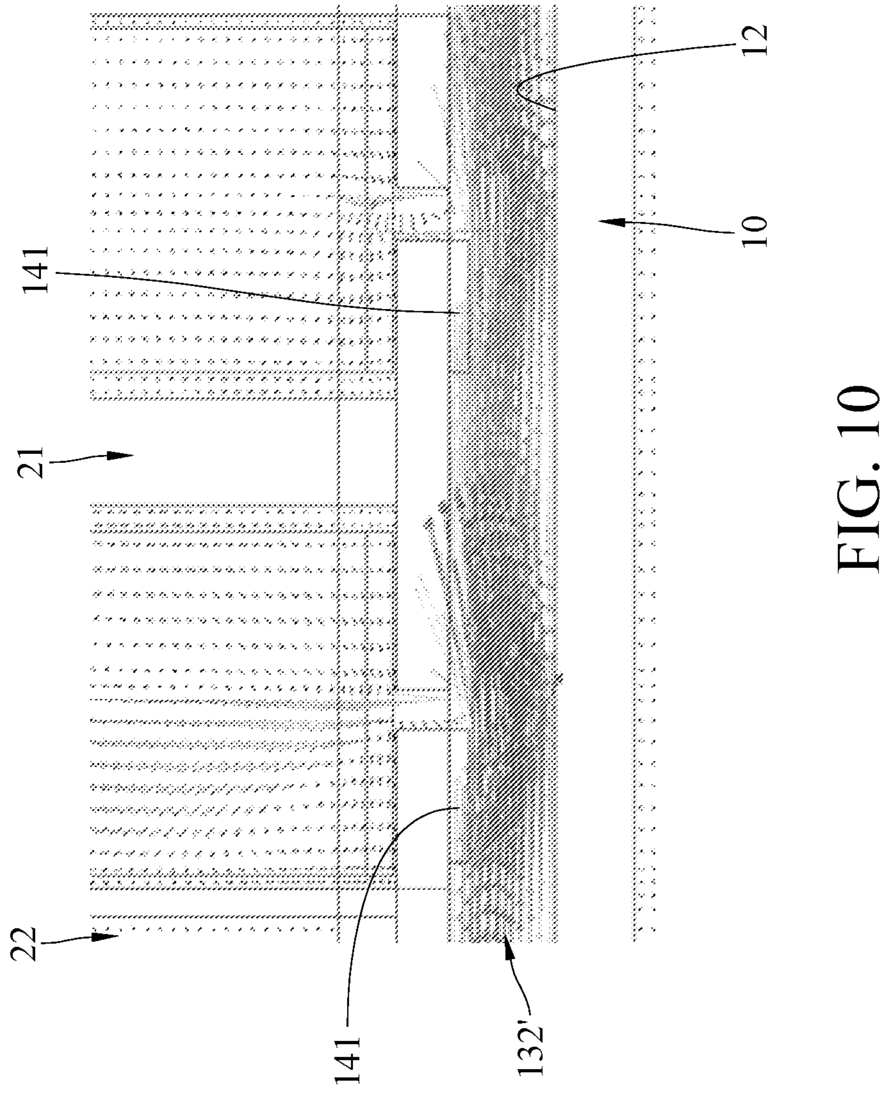
FIG. 10 is a simulation diagram showing guiding effect at choke blocks of the cold plate in FIG. 8.
Figure 11:
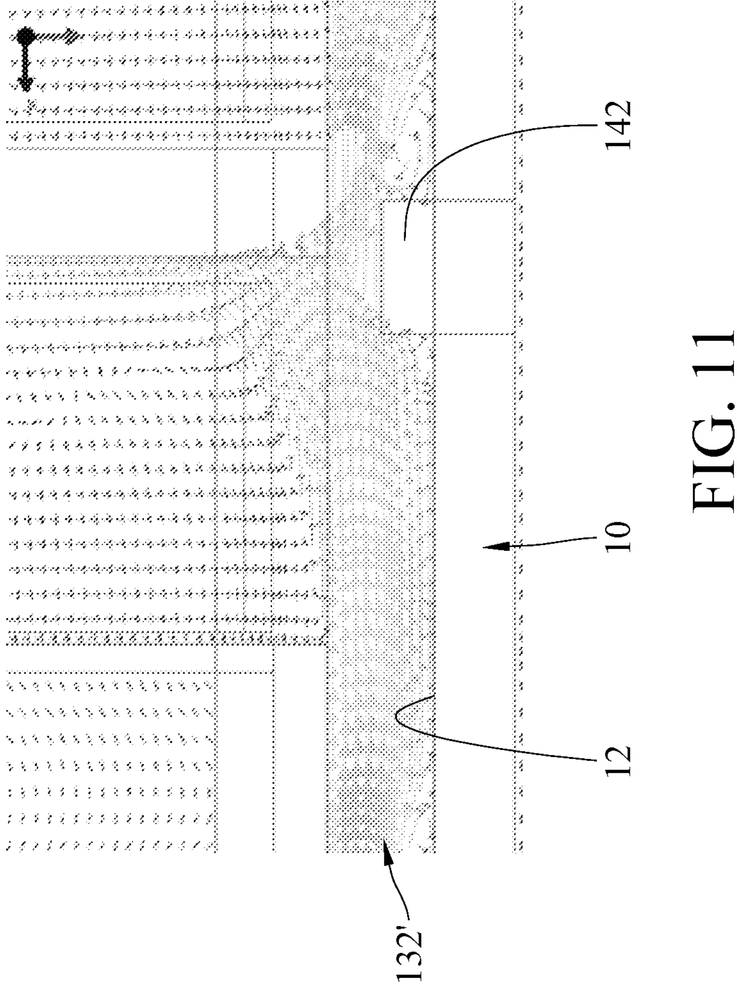
FIG. 11 is a simulation diagram showing guiding effect at guide blocks of the cold plate in FIG. 8.

For this, referring to both FIGS. 10 and 11, they are simulation diagrams showing guide effect at the choke blocks 141 and the guide blocks 142 of the cold plate 1*b* in FIG. 8. It can be seen that the choke blocks 141 and the guide blocks 142 facilitate to increase the resistance to the coolant entering into the second channel 132'. Based on the similar principle, it can ensure a sufficient amount of coolant to enter into another second channel 132 located farther away from the inlet 101 and the outlet 102, thereby further ensuring a sufficient amount of coolant to flow into one or more first channels 131 located closer to the outlet 102.

Note that the disclosure is not limited thereto. For example, in some other embodiments, the cold plate may include one of the guide blocks and the choke blocks; that is, the cold plate may have one of the guide blocks and the choke blocks disposed in the second channel while the other of the guide blocks and the choke blocks is omitted. The modified cold plates may also uniformly distribute the coolant to all of the first channels.

Figures 12, 13:
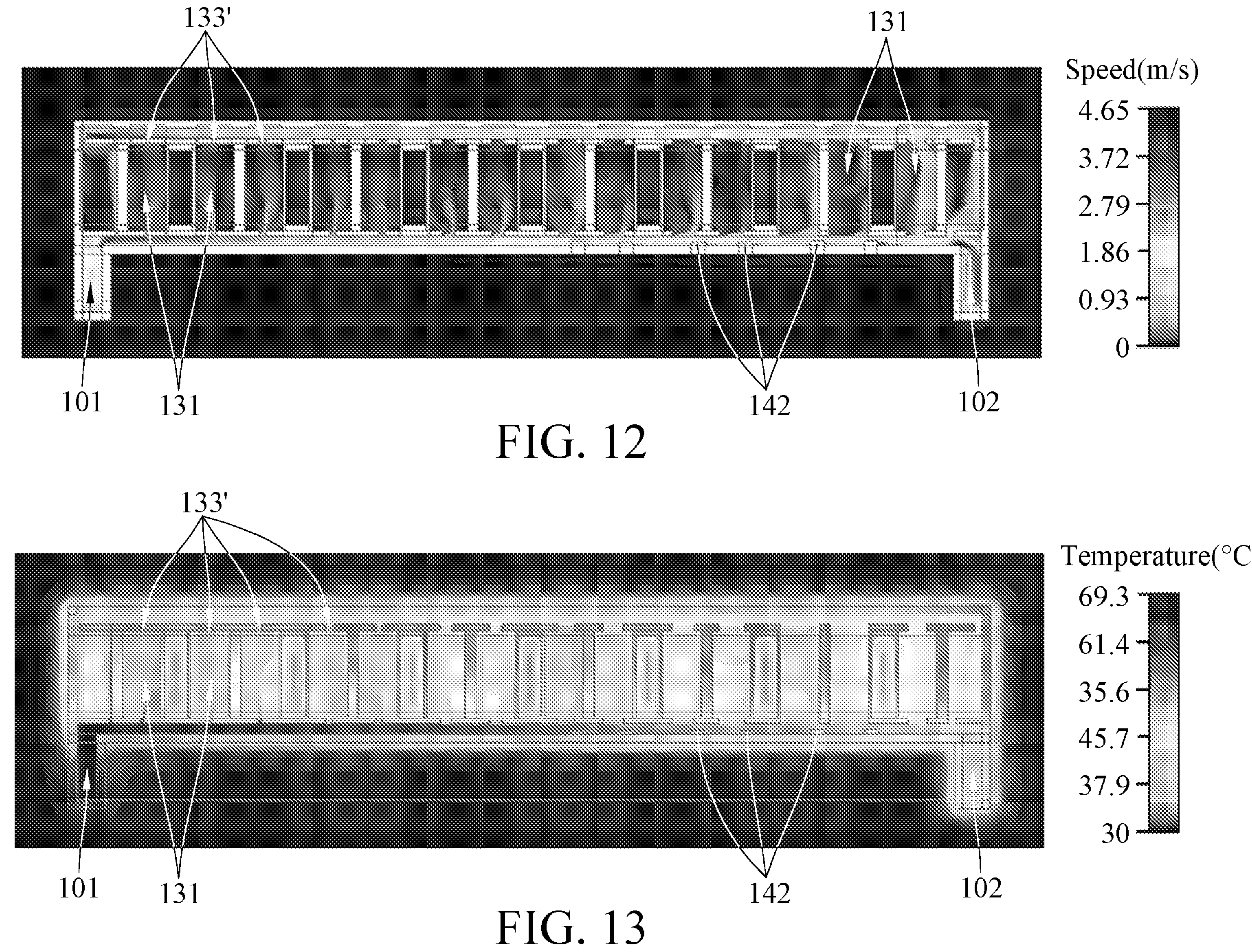
FIG. 12 is a simulation diagram of a distribution of flow velocity in a modified cold plate.
FIG. 13 is a simulation diagram of a distribution of temperature of the modified cold plate.

For example, referring to FIGS. 12 and 13, they are simulation diagrams of a distribution of flow velocity and a distribution of temperature of a modified cold plate, where the modified cold plate is the aforementioned cold plate 1*b* with the communication channels 133' of different widths shown in FIG. 7 but without the choke blocks 141 shown in FIG. 8. It can be seen that one or more first channels 131 located farther away from the inlet 101 can receive a sufficient amount of coolant so as to maintain a relative low temperature.

Figures 14, 15:
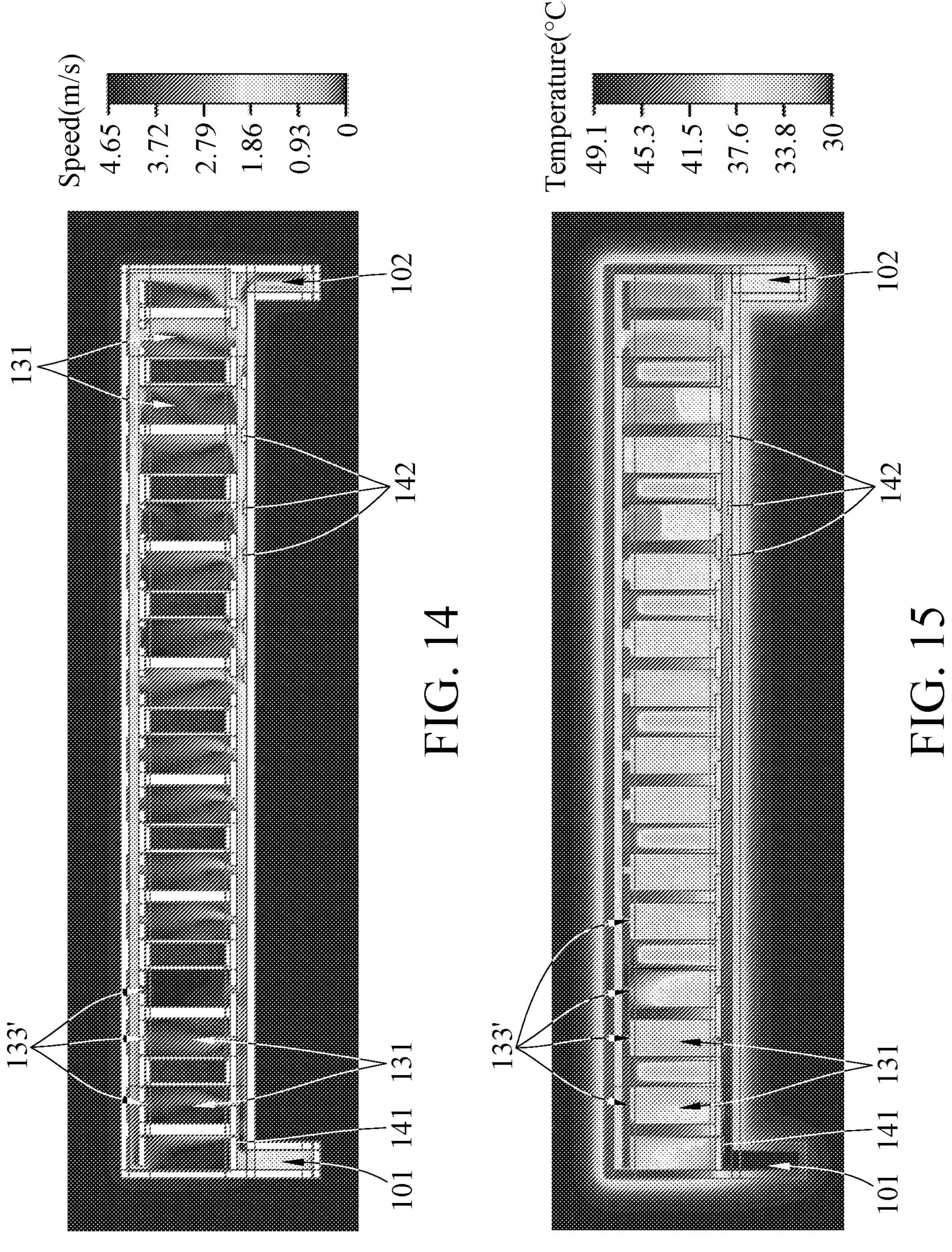
FIG. 14 is a simulation diagram of a distribution of flow velocity in another modified cold plate.
FIG. 15 is a simulation diagram of a distribution of temperature of the another modified cold plate.

It can be understood that, according to actual requirements, the cold plate of some embodiments of the disclosure may have the communication channels 133' of different widths shown in FIG. 7 and the choke blocks 141 and the guide blocks 142 shown in FIG. 8. For example, referring to FIGS. 14 and 15, they are simulation diagrams of a distribution of flow velocity and a distribution of temperature of a modified cold plate, where the modified cold plate is the cold plate 1*b* with the communication channels 133' of different widths shown in FIG. 7. It can be seen that one or more first channels 131 located farther away from the inlet 101 can receive a sufficient amount of coolant so as to maintain a relative low temperature.

Figure 16:
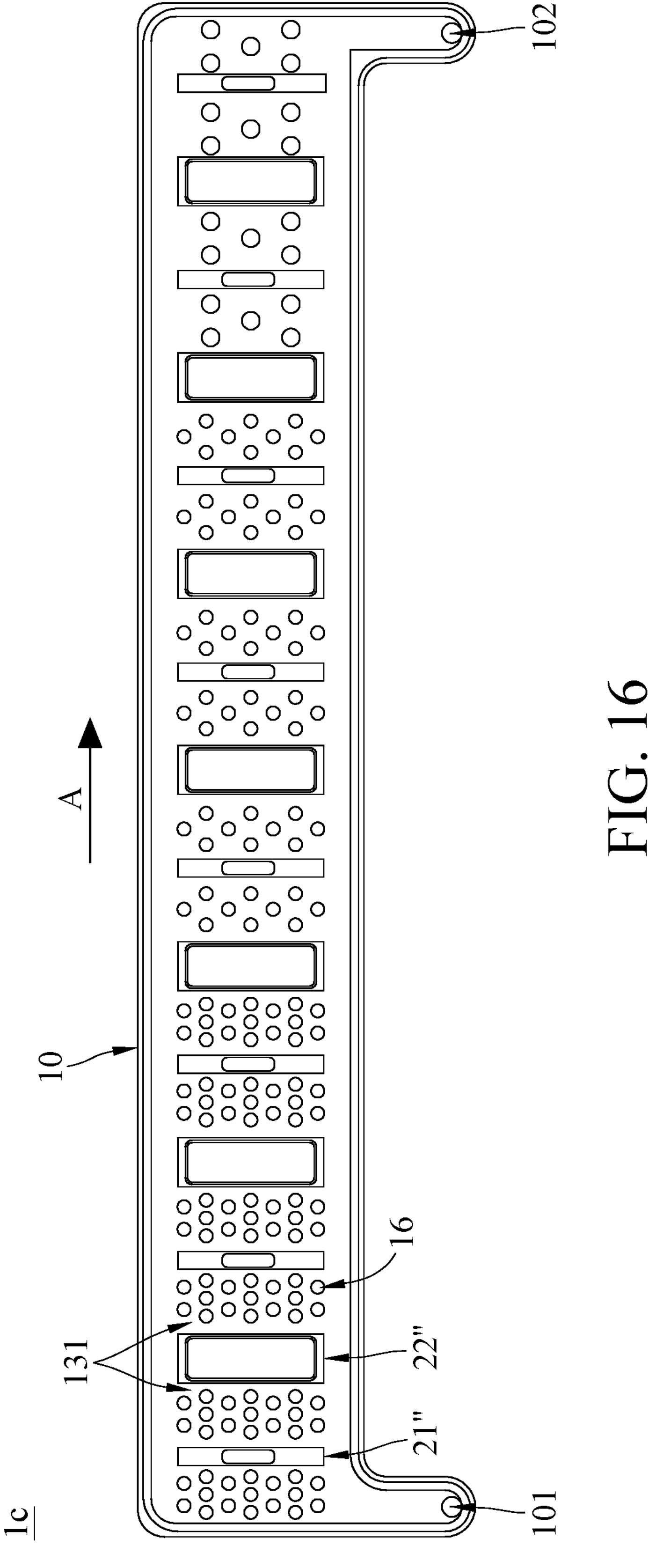
FIG. 16 is a top view of a cold plate according to another embodiment of the disclosure.
Figure 17:
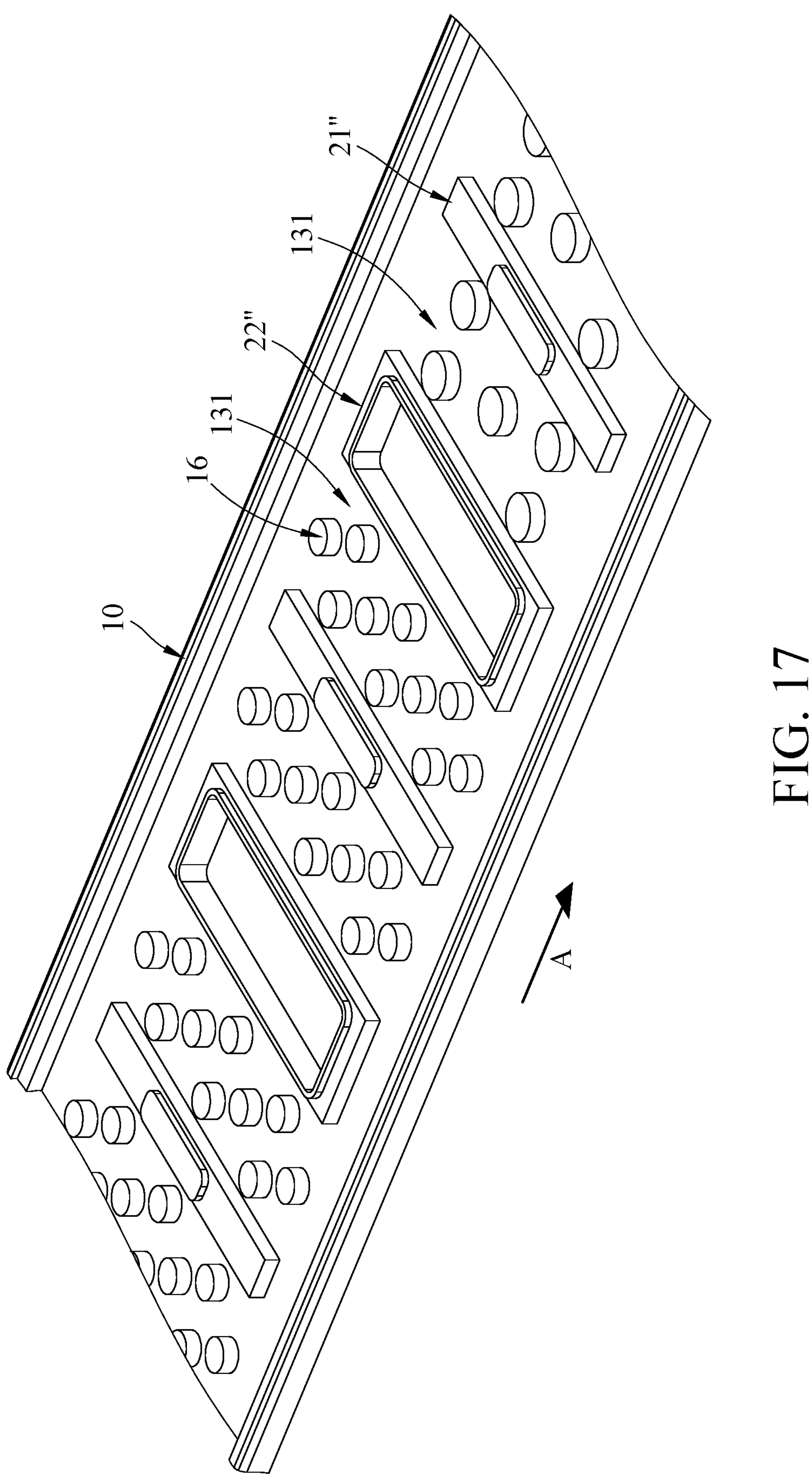
FIG. 17 is a partial and enlarged perspective view of the cold plate in FIG. 16.

Alternatively, referring to FIGS. 16 and 17, another embodiment of the disclosure provides a cold plate 1*c*, and the main difference between the cold plate 1*c* and the cold plate of the previous embodiment is that the cold plate 1*c* may further include a plurality of spoiler structures 16 arranged between the first partition structures 21" and the second partition structures 22". In other words, the spoiler structures 16 may be provided in the first channels 131.

In this embodiment, the spoiler structures 16 may be pillars. The spoiler structures 16 may be arranged in desired arrays in the first channels 131 according to actual requirements, and arrangement densities (or quantities) of the spoiler structures 16 in different first channels 131 may be different from one another. For example, the quantity of the spoiler structures 16 in one or more first channels 131 located closer to the inlet 101 may be greater than the quantity of the spoiler structures 16 in one or more first channels 131 located closer to the outlet 102. More specifically, in this embodiment, the quantities or arrangement densities of the spoiler structures 16 in the first channels 131 may gradually decrease along a direction (i.e., the arrangement direction A) from the inlet 101 toward the outlet 102. This arrangement can facilitate to increase the resistance to the coolant flowing into one or more of the first channels 131 located closer to the inlet 101 so as to ensure a sufficient amount of coolant to flow into one or more of the first channels 131 located closer to the outlet 102.

Figure 18:
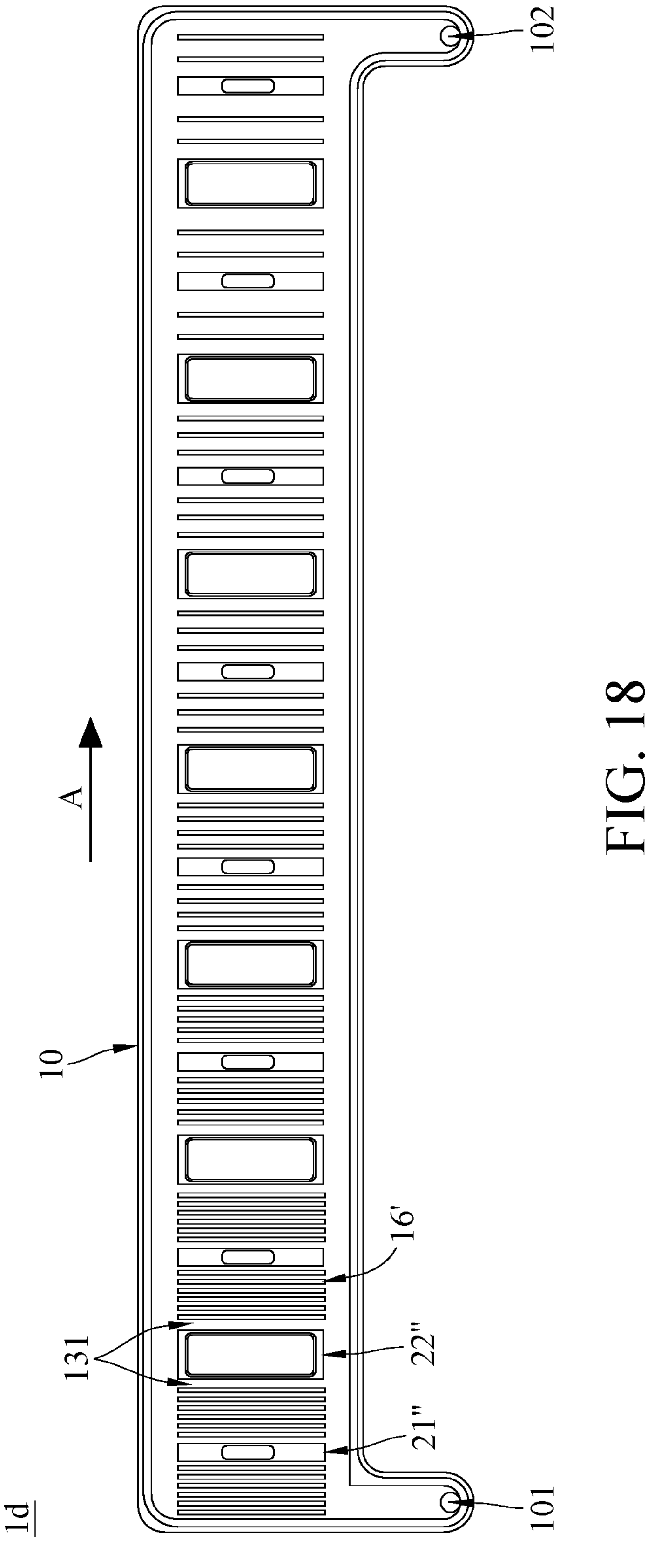
FIG. 18 is a top view of a cold plate according to another embodiment of the disclosure.
Figure 19:
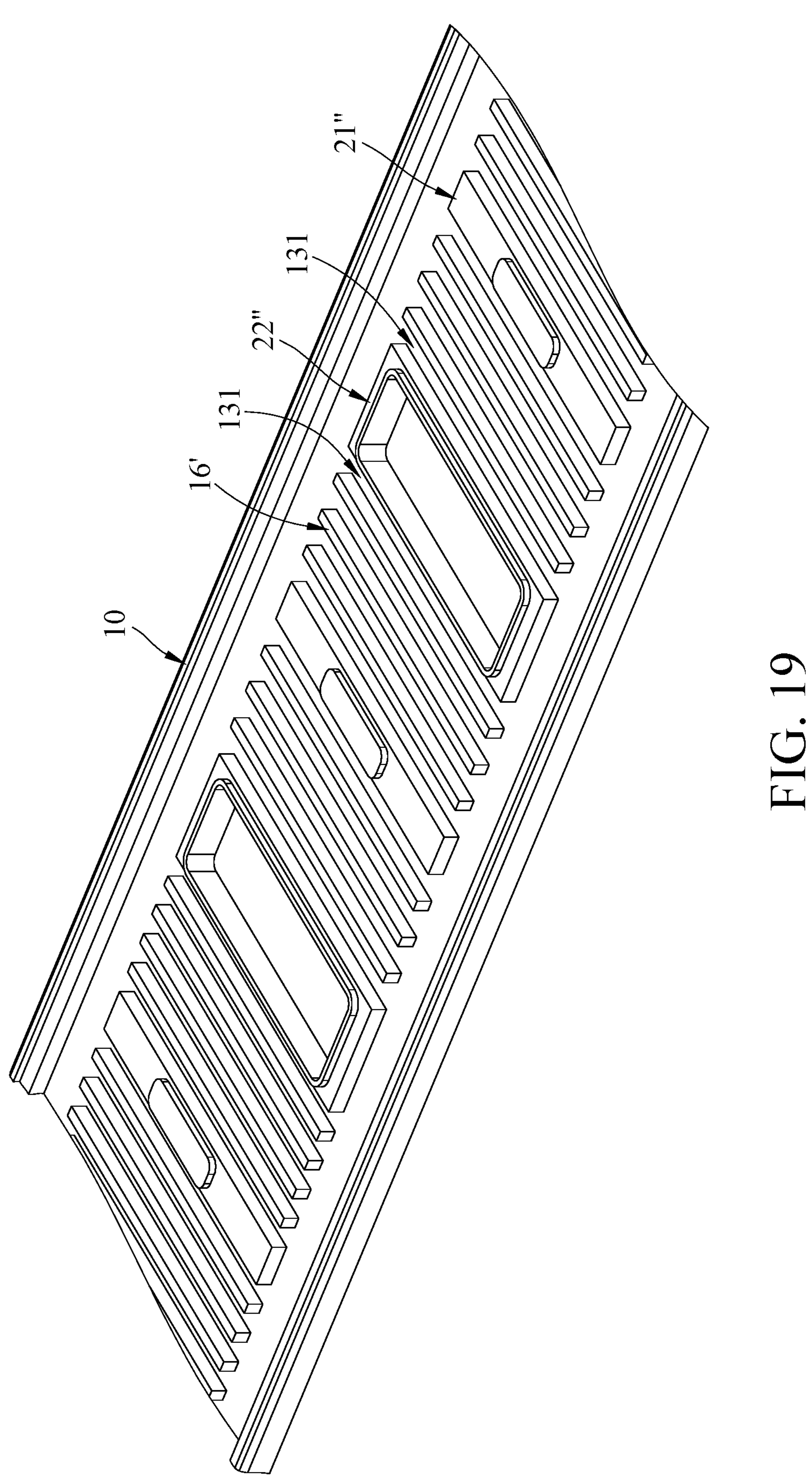
FIG. 19 is a partial and enlarged perspective view of the cold plate in FIG. 18.

Alternatively, referring to FIGS. 18 and 19, another embodiment of the disclosure provides a cold plate 1*d*, and the main difference between the cold plate 1*d* and the cold plate 1*c* of the previous embodiment is that spoiler structures 16' of the cold plate 1*d* may be sheet or long bar-shaped structures. For example, the spoiler structures 16' may be long bar-shaped structures extending along a direction different from (e.g., perpendicular to) the arrangement direction A. Moreover, the quantities or arrangement densities of the spoiler structures 16' in the first channels 131 gradually decrease along a direction from the inlet 101 toward the outlet 102 (or the arrangement direction A). Similarly, the spoiler structures 16' in these first channels 131 can facilitate to increase the resistance to the coolant flowing into one or more of the first channels 131 located closer to the inlet 101 so as to ensure a sufficient amount of coolant to flow into one or more of the first channels 131 located closer to the outlet 102.

Last but not least, note that the aforementioned embodiments are merely exemplary, and the cold plate may be modified according to a desired distribution of flowing resistance of the chamber. For example, as long as the chamber of the cold plate can have a desired distribution of flowing resistance for enabling the electronic components of the electronic module to receive a sufficient amount of coolant, the quantities of the first partition structures and the second partition structures in the cold plate can be modified according to actual requirements. Moreover, the shapes of the spoiler structures and the arrangement densities of the spoiler structures in the first channels can also be modified according to the desired distribution of the flowing resistance in the chamber. For example, in some other embodiments, the spoiler structures may be wave-shaped. Furthermore, the first partition structures, the branch portions thereof, the second partition structures and the branch portion thereof may each have different inclined angle or shape for forming a desired distribution of the flowing resistance in different areas of the chamber of the liquid cooling main body. In addition, the first partition structures, the second partition structures and the spoiler structures of different shapes and structures in the aforementioned embodiments can be mixed and used in one cold plate according to the desired distribution of the flowing resistance in the chamber.

According to the cold plates and the electronic device as discussed in the above embodiments, since the liquid cooling main body having only one inlet and only one outlet is used to be in thermal contact with a plurality of electronic components, compared with conventional means where each heat source is provided with one set of a cold plate, an inlet pipe and an outlet pipe, the cold plate of the disclosure can facilitate to achieve a lightweight liquid cooling system in which the cold plate is applied and simplify involved pipelines for easy arrangement and installation of the pipelines. Moreover, the liquid cooling main body of the cold plate of the disclosure has the partition structures disposed therein for dividing the chamber into a plurality of first channels and two second channels, and thus in the case that the liquid cooling main body has only one inlet and only one outlet, the chamber can have a desired distribution of flowing resistance for enabling the electronic components to receive a sufficient amount of coolant.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An electronic device, comprising:

a casing;

an electronic module, accommodated in the casing; and a cold plate, located in the casing, comprising:

a liquid cooling main body, in thermal contact with the electronic module, having an inlet, an outlet and a chamber in communication with the inlet and the outlet; and a plurality of partition structures, located in the chamber, defining a plurality of first channels, two second channels and a plurality of communication channels in the chamber, wherein the plurality of first channels are located between and in communication with the two second channels through the plurality of communication channels;

wherein an extension direction of each of the plurality of first channels is different from an extension direction of each of the two second channels, and one of the two second channels is directly in communication with one of the inlet and the outlet;

wherein the plurality of first channels are arranged along an arrangement direction, each of the plurality of partition structures comprises a main portion and two branch portions, the main portion extends along a direction different from the arrangement direction, and the two branch portions are respectively connected to two opposite ends of the main portion and extend along the arrangement direction;

wherein each of the plurality of communication channels is formed between adjacent two of the branch portions of the plurality of partition structures.

2. The electronic device according to claim 1, wherein the plurality of partition structures comprises a first partition structure and a second partition structure, the first partition structure and the second partition structure are in a staggered arrangement, the electronic module comprises a plurality of electronic components, the plurality of partition structures and the plurality of electronic components both are arranged along the arrangement direction, and the plurality of first channels respectively correspond to the plurality of electronic components.

3. The electronic device according to claim 2, wherein the liquid cooling main body has a through hole portion, and the through hole portion is disposed on the second partition structure and corresponds to a gap between two adjacent electronic components of the plurality of electronic components.

4. The electronic device according to claim 3, further comprising a plurality of fasteners, wherein the plurality of fasteners are disposed through the through hole portion, and the cold plate is pressed against by the plurality of fasteners, and the plurality of electronic components are removably engaged with the plurality of fasteners.

5. The electronic device according to claim 1, wherein the liquid cooling main body has an inner surface defining the chamber, the plurality of first channels in the chamber are defined by the main portions of the plurality of partition structures, the two second channels in the chamber are defined by the two branch portions of the plurality of partition structures and the inner surface, and opposite ends of the plurality of first channels are located between and in communication with the two second channels through the plurality of communication channels.

6. The electronic device according to claim 5, wherein a width of each of the plurality of first channels is greater than a width of each of the plurality of communication channels.

7. The electronic device according to claim 6, wherein the width of each of the plurality of communication channels gradually decreases along a direction from the outlet toward the inlet.

8. The electronic device according to claim 5, wherein the cold plate further comprises a choke block, the choke block is disposed in one of the two second channels directly in communication with the inlet and the outlet, the choke block is located relatively close to the inlet than to the outlet, and the choke block protrudes from one end of one of the two branch portions of the plurality of partition structures located relatively farther than another end of one of the two branch portions from the inlet.

9. The electronic device according to claim 1, wherein the cold plate further comprises a guide block, the guide block protrudes from an inner surface of the chamber and is located in one of the two second channels directly in communication with the inlet and the outlet, and the guide block is located relatively close to the outlet than to the inlet and corresponds to one end of one of the two branch portions of the plurality of partition structures located relatively close to the outlet than to the inlet.

10. The electronic device according to claim 1, wherein the cold plate further comprises a plurality of spoiler structures, the plurality of spoiler structures are located in the plurality of first channels, and an arrangement density of each of the plurality of spoiler structures in the plurality of first channels gradually decreases along a direction from the inlet toward the outlet.

11. A cold plate, comprising:

a liquid cooling main body, having an inlet, an outlet and a chamber in communication with the inlet and the outlet; and a plurality of partition structures, located in the chamber, defining a plurality of first channels, two second channels and a plurality of communication channels in the chamber, wherein the plurality of first channels are located between and in communication with the two second channels through the plurality of communication channels;

wherein an extension direction of each of the plurality of first channels is different from an extension direction of each of the two second channels, and one of the two second channels is directly in communication with one of the inlet and the outlet;

wherein the plurality of first channels are arranged along an arrangement direction, each of the plurality of partition structures comprises a main portion and two branch portions, the main portion extends along a direction different from the arrangement direction, and the two branch portions are respectively connected to two opposite ends of the main portion and extend along the arrangement direction;

wherein each of the plurality of communication channels is formed between adjacent two of the branch portions of the plurality of partition structures.

12. The cold plate according to claim 11, wherein the liquid cooling main body has a through hole portion, the plurality of partition structures comprises a first partition structure and a second partition structure, the first partition structure and the second partition structure are in a staggered arrangement, and the through hole portion is disposed on the second partition structure.

13. The cold plate according to claim 11, wherein the liquid cooling main body has an inner surface defining the chamber, the plurality of first channels in the chamber are defined by the main portions of the plurality of partition structures, the two second channels in the chamber are defined by the two branch portions of the plurality of partition structures and the inner surface, and opposite ends of the plurality of first channels are located between and in communication with the two second channels through the plurality of communication channels.

14. The cold plate according to claim 13, wherein a width of each of the plurality of first channels is greater than a width of each of the plurality of communication channels.

15. The cold plate according to claim 14, wherein the width of each of the plurality of communication channels gradually decreases along a direction from the outlet toward the inlet.

16. The cold plate according to claim 11, further comprising a choke block, wherein the choke block is disposed in one of the two second channels directly in communication with the inlet and the outlet, the choke block is located relatively close to the inlet than to the outlet, and the choke block protrudes from one end of one of the two branch portions of the plurality of partition structures located relatively farther than another end of one of the two branch portions from the inlet.

17. The cold plate according to claim 11, further comprising a guide block, wherein the guide block protrudes from an inner surface of the chamber and is located in one of the two second channels directly in communication with the inlet and the outlet, and the guide block is located relatively close to the outlet than to the inlet and corresponds to one end of one of the two branch portions of the plurality of partition structures located relatively close to the outlet than to the inlet.

18. The cold plate according to claim 11, further comprising a plurality of spoiler structures, wherein the plurality of spoiler structures are located in the plurality of first channels, and an arrangement density of each of the plurality of spoiler structures in the plurality of first channels gradually decreases along a direction from the inlet toward the outlet.

* * * * *